(12) United States Patent
Kang et al.

(10) Patent No.: US 7,285,493 B2
(45) Date of Patent: Oct. 23, 2007

(54) METHODS OF FORMING A METAL LAYER USING TRANSITION METAL PRECURSORS

(75) Inventors: Sang-Bom Kang, Seoul (KR); Gil-Heyun Choi, Gyeonggi-do (KR); Kwang-Jin Moon, Gyeonggi-do (KR); Hyun-Su Kim, Gyeonggi-do (KR); Seung-Gil Yang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 108 days.

(21) Appl. No.: 10/818,718

(22) Filed: Apr. 6, 2004

(65) Prior Publication Data

US 2004/0203233 A1     Oct. 14, 2004

(30) Foreign Application Priority Data

Apr. 8, 2003     (KR)     .................. 10-2003-0022123

(51) Int. Cl.
  *H01L 21/44* (2006.01)
(52) U.S. Cl. .................. 438/680; 438/681; 438/682; 438/683
(58) Field of Classification Search ......... 438/680–683
  See application file for complete search history.

(56) References Cited

U.S. PATENT DOCUMENTS 4,814,294 A     3/1989    West et al.
6,346,477 B1 *  2/2002    Kaloyeros et al. ........... 438/680
6,444,263 B1 *  9/2002    Paranjpe et al. ............ 427/250

OTHER PUBLICATIONS

Rhee et al., "Epitaxial growth of a (100) $CoSi_2$ layer from carbonic cobalt films deposited on (100) Si substrate using an organometallic source", *Applied Physics Letter*, vol. 74, No. 7, pp. 1003-1005.

Rhee et al., "Cobalt Metallorganic Chemical Vapor Deposition and Formation of Epitaxial $CoSi_2$ Layeron Si(100) Substrate", *Journal of The Electrochemical Society*, 146(7) 2720-2724 (1999).

Ivanova et al., "The Effects of Processing Parameters in the Chemical Vapor Deposition of Cobalt from Cobalt Tricarbonyl Nitrosyl" *Journal of The Electrochemical Society*, 146 (6) 2139-2145 (1999).

* cited by examiner

*Primary Examiner*—Dung A. Le
(74) *Attorney, Agent, or Firm*—Myers Bigel Sibley & Sajovec (57) ABSTRACT

Methods for depositing a metal layer on an integrated circuit device comprising providing a transition metal precursor, carrier gas and hydrogen gas to a deposition chamber such that the partial pressure of the precursor and carrier gas exceeds about 0.25 Torr and the partial pressure of hydrogen gas exceeds about 2.5 Torr are disclosed. Methods of forming a cobalt layer on an integrated circuit device are also disclosed.

23 Claims, 7 Drawing Sheets

FIG. 10B

METHODS OF FORMING A METAL LAYER USING TRANSITION METAL PRECURSORS

CROSS-REFERENCE TO RELATED APPLICATIONS

The present application claims priority from Korean Patent Application No. 2003-22123 filed on Apr. 8, 2003, the contents of which are herein incorporated by reference in its entirety as if set forth fully herein.

BACKGROUND OF THE INVENTION

1. Field of the Invention

The present invention relates to compositions and methods for depositing a metal layer. More particularly the present invention relates to compositions for depositing a cobalt layer on an integrated circuit device having high purity and good step coverage and to methods of forming a metal layer using the same.

2. Description of the Related Art

In an information society, an integrated circuit device having rapid data transferring speed is required so as to process information rapidly. However, as the integrated circuit device becomes highly integrated, the manufacturing process may become difficult. As the length of a gate electrode becomes shorter, and the junction depth of source and drain electrodes becomes shallow, resistance between the gate electrode and the source/drain electrode increases. As the resistance increases, the operational speed of the integrated circuit device decreases while the power consumption of the integrated circuit device increases. Due to the demand for faster processing speeds in integrated circuits, the size of features in these circuits has been steadily shrinking. However, as device dimensions are scaled down, increasingly stringent requirements are being placed on the properties and performance of the materials used. These stringent conditions have increased impurities in the integrated circuit devices.

In order to avoid the above-mentioned problem, a metal-silicide layer, such as a tungsten-silicide layer, titanium-silicide layer, cobalt-silicide layer, etc., can be formed on a gate electrode region, and source and drain electrode regions. It has been found that the cobalt-silicide layer has a low resistivity, low silicon consumption and high thermal and chemical stability. Thus, the cobalt-silicide layer can be widely used for highly integrated circuit devices.

In the past, in order to form the cobalt-silicide layer, cobalt was deposited on a silicon substrate or silicon pattern to form a cobalt layer via physical vapor deposition (hereinafter, referred to as PVD) method. The cobalt layer then would undergo a thermal process so that cobalt reacts with silicon to form the cobalt-silicide layer. However, when the cobalt layer is deposited via the PVD method step coverage of the cobalt layer is often deteriorated. Regions where the cobalt layer was deposited often had a misuniform or curved pattern, which affected the overall results of the integrated circuit device.

Figure 1:
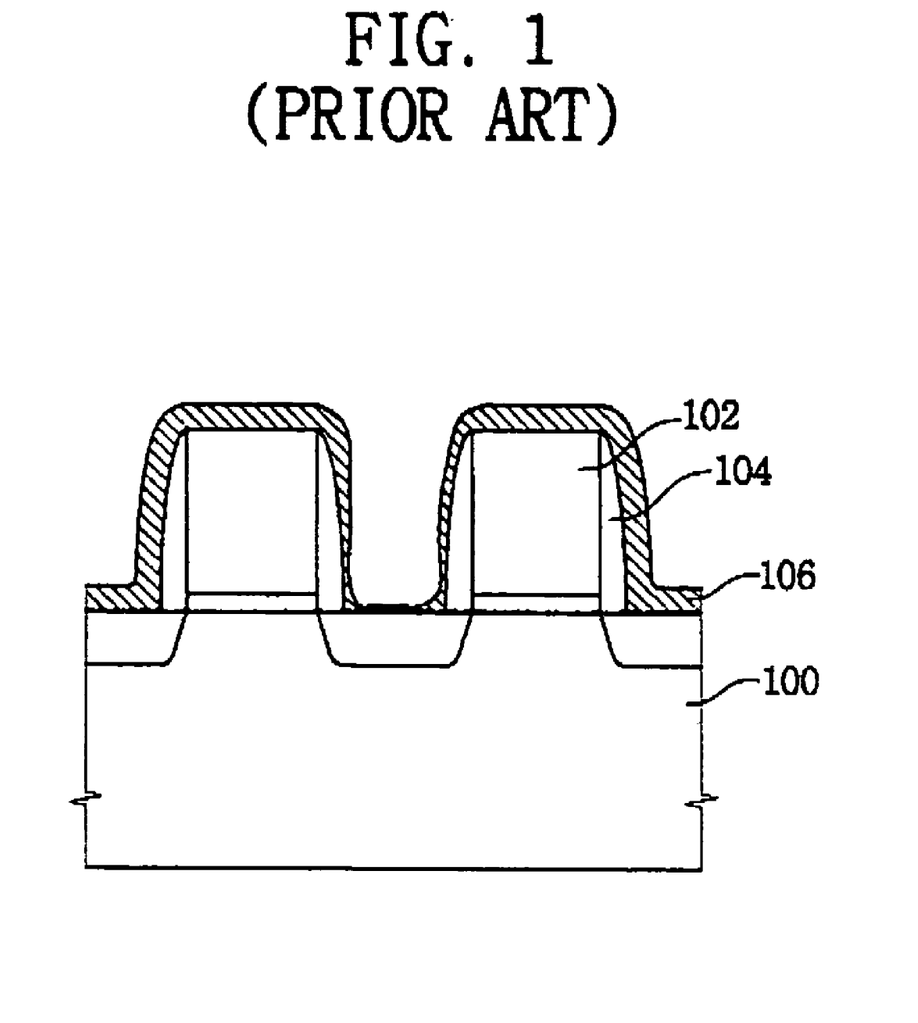
FIG. 1 is a cross-sectional view showing a cobalt layer deposited by PVD.

FIG. 1 illustrates a cross-sectional view showing a cobalt layer deposited via a general PVD method known in the art. In FIG. 1, a minute gate pattern 102 is formed on an integrated circuit device 100. A spacer 104 is formed at a side of the gate pattern 102. A cobalt layer 106 covers the gate pattern 102, the spacer 104, and the integrated circuit device 100. FIG. 1 illustrates that the cobalt layer 106 is deposited via a PVD method. The cobalt layer 106 deposited by the PVD method does not have a uniform thickness. FIG. 1 illustrates that the cobalt layer 106 formed on the integrated circuit device 100 and spacer 104 between the gate patterns 102 has a thinner thickness than the cobalt layer 106 formed on other portions of the integrated circuit device. When the thickness of the cobalt layer 106 is not uniform, the subsequent cobalt-silicide layer formed via the thermal process is also not uniform. Thus, the integrated circuit is not reliable. In order to deposit the cobalt layer 106 uniformly a chemical vapor deposition (CVD) method has been developed.

For example, U.S. Pat. No. 6,346,477, issued to Kaloyeros et al., discloses a method of depositing a cobalt layer on a silicon substrate via CVD method using $Co(CO)_3NO$ as a precursor. However, in Kaloyeros et al., the silicon is oxidized by oxygen of the precursor or by oxygen generated during CVD as a byproduct, so that an oxidation layer is formed at an interface between the silicon face and the cobalt layer. This oxidation layer prevents a reaction between the cobalt and silicon, thus preventing high purity for the integrated circuit device.

Other CVD processes for the deposition of cobalt and cobalt disilicide are known in the art. Ivanova et. al. disclosed a CVD process for the formation of cobalt films from cobalt tricarbonyl nitrosyl, $Co(CO)_3NO$ (*J. Electrochem. Soc.*, 146, 2139–2145 (1999)). West et al. (U.S. Pat. No 4,814,294) described the use of a cobalt source precursor along with silane as a silicon source precursor for the deposition of cobalt disilicide. Dicobalt octacarbonyl, $Co_2(CO)_8$ and cobalt tricarbonyl nitrosyl $Co(CO)_3No$ are known as suitable cobalt source precursors. Rhee et al. reported a CVD approach for the growth of epitaxial $CoSi_2$ through a two step process which involved, in a first step, the deposition of a Co—C film through the CVD decomposition of the cobalt source dicobalt octacarbonyl, $Co_2(CO)_8$, or cyclopentadienyl-cobalt dicarbonyl, $C_5H_5CO(CO)_2$ (*J. Electrochem. Soc.*, 146, 2720 (1999)). This was followed, in a second step, by an ex-situ thermal annealing step at 800° C. to form the epitaxial $CoSi_2$ phase. Unfortunately, the process described has several drawbacks which have prevented commercial acceptance. First, dicobalt octacarbonyl has some serious limitations as a cobalt source precursor. Thermodynamically favorable polymerization and hydrogenation reactions in a CVD chamber compete with the formation of pure cobalt. These reactions include polymerization reactions in the gas phase and reactions with hydrogen yielding highly volatile and extremely unstable hydrocobalt tetracarbonyl compounds. The compound is also known to be unstable during storage, even under vacuum or inert atmosphere. Second, the process also requires a high temperature annealing step (over 800° C.) to form the desired $CoSi_2$ epitaxial phase. Rhee et al. also discloses a method of forming cobalt layer on a silicon substrate by metal organic chemical vapor deposition (MOCVD) using $Co_2(CO)_8$, $Co(C_5H_5)_2$, $Co(C_5H_5)(CO)_2$ and $CoCF_3(CO)_4$ as precursors (*Applied physics letters* vol. 74 no. 7 (1999)). However, this method results in an increase in the resistivity of the cobalt layer because of numerous impurities. Accordingly, it may be beneficial to produce new compositions and methods for depositing a cobalt layer on an integrated circuit device.

SUMMARY OF THE INVENTION

The present invention provides compositions for depositing a metal layer having high purity. The present invention also provides methods of depositing a metal layer having good step coverage. Further, the present invention provides methods of depositing a cobalt layer having high purity and good step coverage. The present invention also provides methods of depositing a cobalt layer on an insulation layer including a contact hole. Other aspects of the present invention include methods of depositing a cobalt layer on an integrated circuit device having gate electrode pattern formed thereon.

The present invention also includes compositions for depositing a metal layer comprising a transition metal precursor, a carrier gas of about 1 to 39 parts by volume, and a hydrogen gas of about 1 to 399 parts by volume.

Additional embodiments of the present invention include methods of depositing a metal layer on an integrated circuit device, comprising loading the integrated circuit device in a deposition chamber, providing the deposition chamber with a transition metal precursor, providing the deposition chamber with a carrier gas, such that a partial pressure of the precursor and carrier gas exceeds about 0.25 Torr, and providing the deposition chamber with a hydrogen gas, such that a partial pressure of the hydrogen gas exceeds about 2.5 Torr.

Embodiments of the present invention also include methods of forming a cobalt layer on an integrated circuit device comprising depositing a cobalt precursor on an integrated circuit device in a deposition chamber, providing hydrogen gas into the deposition chamber, and decomposing the cobalt precursor on the integrated circuit device to form a cobalt layer.

Additional embodiments include methods of forming a cobalt layer on an integrated circuit device, comprising forming an insulation layer on an integrated circuit device, removing a portion of the insulation layer to form a contact hole that exposes the integrated circuit device, depositing a cobalt precursor into a deposition chamber, supplying a hydrogen gas into the deposition chamber, and decomposing the cobalt precursor on the integrated circuit device to form a cobalt layer on at least one side and at least one bottom surface of the contact hole, and on the top surface of the insulation layer.

The present invention also includes methods of forming a cobalt layer of integrated circuit device, comprising forming a gate having a gate insulation layer and conductive layer pattern on a integrated circuit device, forming a spacer on a side surface of the gate, depositing a cobalt precursor on the integrated circuit device in a deposition chamber, supplying hydrogen gas to the deposition chamber, and decomposing the cobalt precursor on the integrated circuit device to form a cobalt layer on the integrated circuit device, the spacer and the top surface of the gate.

Additional embodiments of the present invention include chemical vapor deposition systems comprising a deposition chamber having an integrated circuit device positioned therein, a vessel containing a transition metal precursor composition comprising a source of an inert carrier gas for transferring the precursor composition to the chemical vapor deposition chamber such that a partial pressure of the precursor and carrier gas provided into the deposition chamber exceeds about 0.25 Torr, and hydrogen gas, such that a partial pressure of the hydrogen gas provided into the deposition chamber exceeds about 2.5 Torr.

DETAILED DESCRIPTION OF THE INVENTION

The foregoing and other aspects of the present invention will now be described in more detail with respect to the embodiments described herein. It should be appreciated that the invention may be embodied in different forms and should not be construed as limited to the embodiments set forth herein. Rather, these embodiments are provided so that this disclosure will be thorough and complete, and will fully convey the scope of the invention to those skilled in the art. It will be understood that when an element such as a layer, a region or an integrated circuit device is referred to as being "on" another element, it can be directly on the other element or intervening elements may also be present. It will be understood that if part of an element, such as a surface of a conductive line, is referred to as "outer", it is closer to the outside of the integrated circuit than other parts of the element. Furthermore, relative terms such as "beneath" may be used herein to describe a relationship of one layer or region to another layer or region relative to an integrated circuit device or a base layer as illustrated in the figures. It will be understood that these terms are intended to encompass different orientations of the device in addition to the orientation depicted in the figures. Finally, the tern "directly" means that there are no intervening elements.

The term "transition metal precursor" is a precursor of an organic compound including a transition metal.

Some of the embodiments of the present invention include methods of depositing a metal layer on an integrated circuit device. These methods include loading an integrated circuit device into a deposition chamber wherein a transition metal precursor and carrier gas are applied to the integrated circuit device. The partial pressure of the precursor and carrier gas provided exceeds about 0.25 Torr in the deposition chamber. Next, the deposition chamber is provided with hydrogen gas, wherein the partial pressure of the hydrogen gas provided exceeds about 2.5 Torr.

Embodiments of the present invention also include transition metal precursors wherein the precursors are cobalt precursors. These cobalt precursors can have a cobalt-cobalt bond. The cobalt precursors may include, but are not limited to dicobalt hexacarbonyl t-butylacetylene [Co$_2$(CO)$_6$(HC≡C$^t$Bu)], dicobalt hexacarbonyl phenylacetylene [Co$_2$(CO)$_6$(HC≡CPh)], dicobalt hexacarbonyl methylacetylene [Co$_2$(CO)$_6$(HC≡CCH$_3$)], dicobalt hexacarbonyl dimethylacetylene [Co$_2$(CO)$_6$(CH$_3$C≡CCH$_3$)], cobalt tricarbonyl nitrosyl; cobalt tetracarbonyl iodide, cobalt tetracarbonyl trichlorosilane, carbonyl chloride tris(trimethylphosphine) cobalt, cobalt tricarbonyl-hydrotributylphosphine, acetylene dicobalt hexacarbonyl and acetylene dicobalt pentacarbonyl triethylphosphine, and is preferably cobalt tricarbonyl nitrosyl. The cobalt precursors presented in the deposition chamber may be applied either alone or in any combination of the various compounds described above or known in the art.

One of the cobalt precursors that may be utilized with the embodiments of the present invention is dicobalt hexacarbonyl t-butylacetylene (CCTBA: Co$_2$(CO)$_6$(HC≡C$^t$Bu)). CCTBA can be bubbled so that it is vaporized. The CCTBA can be in a liquid state at a room temperature before its use making it thermally stable. CCTBA is represented by the following formula 1.

Formula 1

Vaporized CCTBA can be provided in a deposition chamber in which an integrated circuit device can be loaded. The vaporized CCTBA can be carried into the deposition chamber by using argon gas as a carrier. Hydrogen gas is also provided into the deposition chamber. The hydrogen gas removes each element that is combined with cobalt from the CCTBA. Thus, the hydrogen gas combines with elements that are combined with cobalt to form a hydrogenated byproduct. The hydrogenated byproduct can then be exhausted out of the deposition chamber, so that a pure cobalt layer is formed on the integrated circuit device.

The hydrogen gas provided into the deposition chamber may be in a molecular state or in a radical state formed by remote plasma. An adequate amount of the hydrogen gas is required in order to remove impurities (or elements that are combined with cobalt). Impurities of the cobalt layer increase resistivity of cobalt layer. Therefore, the amount of the hydrogen gas provided can influence the resistivity of cobalt layer.

In some of the embodiments of the present invention, the hydrogen gas is provided into the deposition chamber, such that the partial pressure of the hydrogen gas is higher than about 2.5 Torr. The partial pressure of hydrogen gas may be obtained from the following equation:

Partial pressure of hydrogen gas=pressure of deposition chamber*(introduced amount of hydrogen/introduced amount of total gas, wherein the 'total gas' includes hydrogen gas and inert gas (or carrier gas) that does not take part in reaction).

The temperature of the deposition chamber can be in a range from about 50° C. to 500° C. when the deposition process is performed. As noted above, the temperature of the deposition chamber can influence the deposition rate such that when the temperature of the deposition chamber is lower than about 50° C. or above 500° C., the cobalt layer is not formed normally. The cobalt layer formed by the methods described throughout the application has good step coverage and high purity. Furthermore, an oxidation layer is not formed between the cobalt layer and an integrated circuit device such as a silicon substrate so that a cobalt silicide layer may be easily formed on the integrated circuit device.

Embodiments of the present invention also include compositions wherein the compositions comprise the transition metal precursor, a carrier gas with about 1 to 39 parts by volume, and a hydrogen gas with about 1 to 399 parts by volume. This composition can be induced into a deposition chamber at a pressure from about 2.75 Torr to 100 Torr. Thus, the partial pressure of the transition metal precursor and the carrier gas can have a value from about 0.25 Torr to 97.5 Torr. The partial pressure of the hydrogen gas can have a value from about 2.5 Torr to 99.75 Torr.

In another embodiment of the present invention, the transition metal precursor and carrier gas are about 1 to 5 parts by volume, and the hydrogen gas is about 1 to about 59 parts by volume. This combination can be induced at a pressure from about 2.75 Torr to 15 Torr.

In some embodiments of the present invention the transition metal precursors are in a gaseous state. Inert gas such as helium (He), argon (Ar), or nitrogen (N) may be used as a carrier gas to transport the transition metal precursor to an integrated circuit device such as a silicon substrate.

The present invention also includes methods wherein the hydrogen gas reacts with elements that are combined with the transition metal to remove the elements to form a metal layer on the integrated circuit device. The hydrogen may be provided in a gas state or in a radical state by remote plasma.

The present invention is explained in greater detail in the Examples that follow. These examples are intended as illustrative of the invention and are not to be taken as limiting thereof.

EXAMPLE 1

For Example 1, a silicon substrate was loaded in a deposition chamber. The pressure of the deposition chamber was adjusted to be approximately 9 Torr, and the temperature of the deposition chamber was adjusted to be approximately 150° C. Vaporized CCTBA was introduced into the deposition chamber by a carrier gas, which was argon gas, at a flow rate of approximately 100 sccm. Additionally, hydrogen gas was later provided into the deposition chamber at a flow rate of approximately 3000 sccm to form a cobalt layer.

EXAMPLE 2

For Example 2, a cobalt layer was formed under the same conditions as Example 1 except for the flow rate of hydrogen gas. In this example the hydrogen gas was introduced into a deposition chamber at a flow rate at approximately 2000 sccm.

EXAMPLE 3

For Example 3, a cobalt layer was formed under the same conditions as Example 1 except for the flow rate of hydrogen gas. In this example the hydrogen gas was introduced into a deposition chamber at a flow rate of approximately 1000 sccm.

EXAMPLE 4

For Example 4, a cobalt layer was formed under the same conditions as Example 1 except for the flow rate of hydrogen gas. In this example the the hydrogen gas was introduced into a deposition chamber at a flow rate of approximately 500 sccm.

EXAMPLE 5

In Example 5, a silicon substrate was loaded into a deposition chamber. Subsequently, the pressure of the deposition chamber was adjusted to approximately 6 Torr, and the temperature of the deposition chamber was adjusted to approximately 150° C. Vaporized CCTBA was introduced into the deposition chamber by argon gas at a flow rate of approximately 100 sccm. Hydrogen gas was then provided into the deposition chamber at a flow rate of approximately 3000 sccm to form cobalt layer.

EXAMPLE 6

In Example 6, a cobalt layer was formed under the same conditions as Example 5 except for the flow rate of hydrogen gas. In this example the hydrogen gas was introduced into a deposition chamber at a flow rate of approximately 2000 sccm.

EXAMPLE 7

In Example 7, a cobalt layer was formed under the same conditions as Example 5 except for the flow rate of hydrogen gas. In this example the hydrogen gas was introduced into a deposition chamber at a flow rate of approximately 1000 sccm.

EXAMPLE 8

For Example 8, a cobalt layer was formed under the same conditions as Example 5 except for the flow rate of hydrogen gas. In this example the hydrogen gas was introduced into a deposition chamber at a flow rate of approximately 500 sccm.

EXAMPLE 9

In Example 9, a silicon substrate was loaded in a deposition chamber. The pressure of the deposition chamber was adjusted to be approximately 3 Torr, and the temperature of the deposition chamber was adjusted to be approximately 150° C. Vaporized CCTBA was introduced in the deposition chamber by argon gas at a flow rate of approximately 100 sccm. Hydrogen gas was then provided into the deposition chamber at a flow rate of approximately 3000 sccm to form a cobalt layer.

EXAMPLE 10

In Example 10, a cobalt layer was formed under the same conditions as Example 9 except for the flow rate of hydrogen gas. In this example the hydrogen gas was introduced into a deposition chamber at a flow rate of approximately 2000 sccm.

EXAMPLE 11

In Example 11, a cobalt layer was formed under the same conditions as Example 9 except for the flow rate of hydrogen gas. In this example the hydrogen gas was introduced into a deposition chamber at a flow rate of approximately 1000 sccm.

EXAMPLE 12

In Example 12, a cobalt layer was formed under the same conditions as Example 9 except for the flow rate of hydrogen gas. In this example the hydrogen gas was introduced into a deposition chamber at a flow rate of approximately 500 sccm.

Experiment 1

Analyzing Ingredients of the Cobalt Layer

Figure 2:
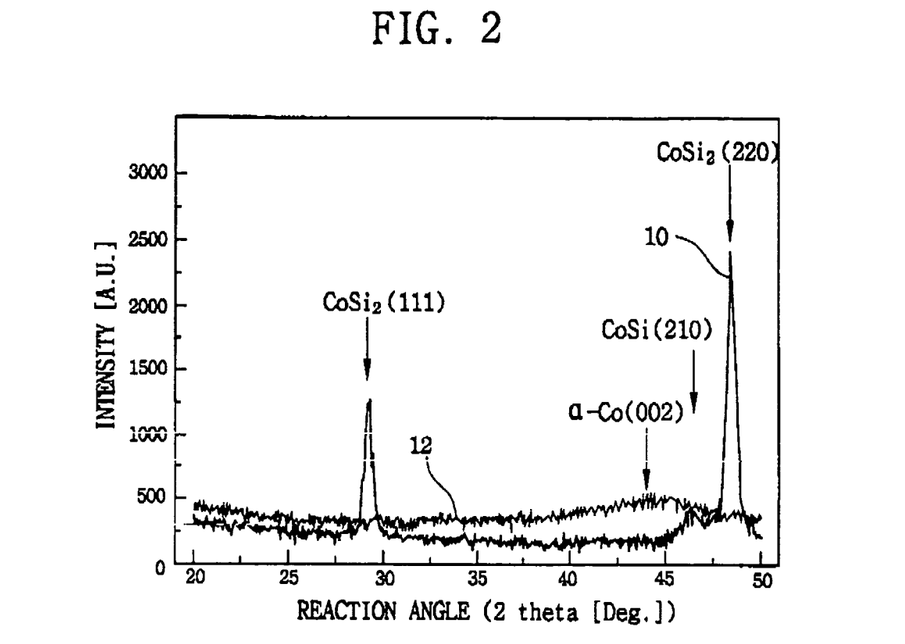
FIG. 2 is an x-ray diffraction (XRD) graph showing ingredients of cobalt layer formed in accordance with Example 12.

FIG. 2 is a graph showing ingredients of cobalt layer formed in accordance with Example 12, which was analyzed by x-ray diffraction. In the graph, the x-axis represents a refraction angle, and the y-axis represents intensity. A first graph 10 corresponds to ingredients of a cobalt layer that was formed tinder the conditions described in Example 12, and second graph 12 corresponds to ingredients of the cobalt layer that were formed under the conditions described in Example 12 and had undergone a rapid thermal process (hereinafter, referred to as RTP).

In the first graph 10, alpha-Cobalt ($\alpha$-Co, 002) was detected in the cobalt layer. No other material was detected. In the second graph 12, cobalt silicide ($CoSi_2$) of (111)-direction and cobalt silicide ($CoSi_2$) of (220)-direction were detected in the cobalt layer that has undergone RTP.

As shown in the results as above, the cobalt layer formed by the method of Example 12 did not include any impurities. Furthermore, the cobalt layer is changed into the cobalt silicide layer normally via RTP. Thus, no oxidation layer preventing reaction between silicon and cobalt was formed between the silicon and cobalt.

Experiment 2

Analyzing the Ingredients of the Cobalt Layer

Figure 3:
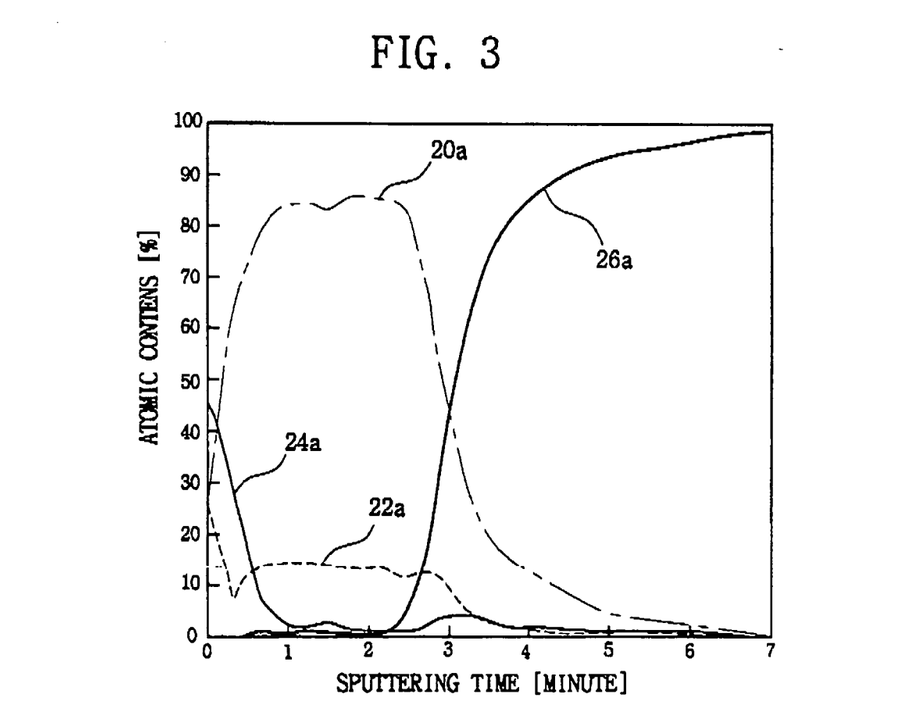
FIG. 3 is a graph depicting ingredients of cobalt layer formed in accordance with Example 1 analyzed by an atomic emission spectrometry (AES).
Figure 4:
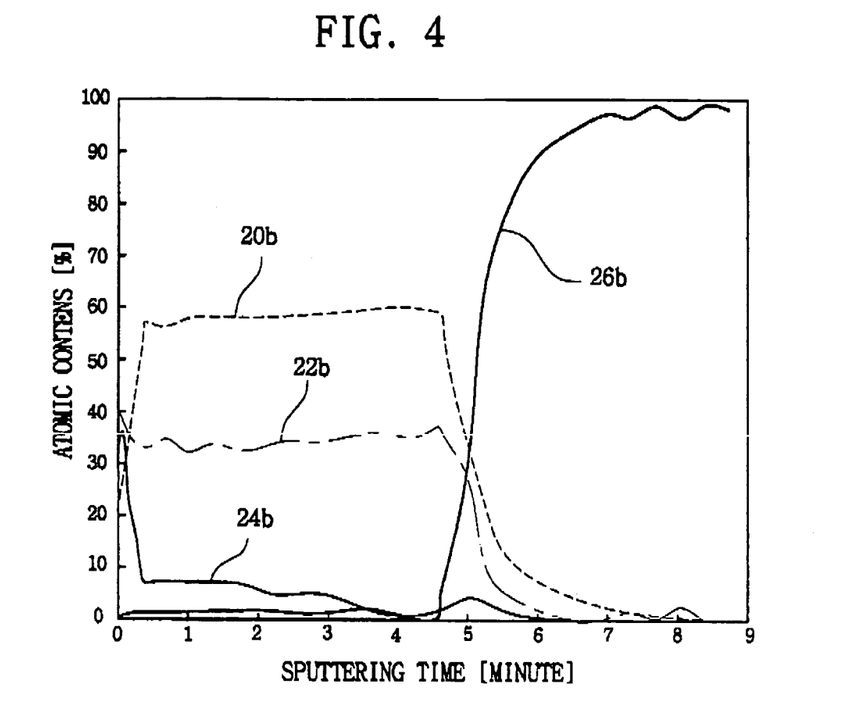
FIG. 4 is a graph showing ingredients of cobalt layer formed in accordance with Example 12 analyzed by AES.

FIG. 3 is a graph showing ingredients of cobalt layer formed in accordance with Example 1, which was analyzed by atomic emission spectrometry, and FIG. 4 is a graph showing ingredients of cobalt layer formed in accordance with Example 12, which was analyzed by AES. In the graphs of FIGS. 3 and 4, the x-axis represents sputtering time, and the y-axis represents atomic contents detected per sputtering time. In FIGS. 3 and 4, first graphs 22a and 22b correspond to carbon atomic content, second graphs 24a and 24b correspond to oxygen atomic content, and third graphs 26a and 26b correspond to silicon atomic content.

Referring to FIG. 3, a cobalt layer formed in accordance with Example 1 included 86% of cobalt, 13% of carbon and 2% of oxygen. Referring to FIG. 4, a cobalt layer formed in accordance with Example 12 included 60% of cobalt, 35% of carbon, and 7% of oxygen. These results illustrate that as the inflow ratio of hydrogen and pressure of the deposition chamber increase, impurities of the cobalt layer decrease.

Experiment 3

Figure 5:
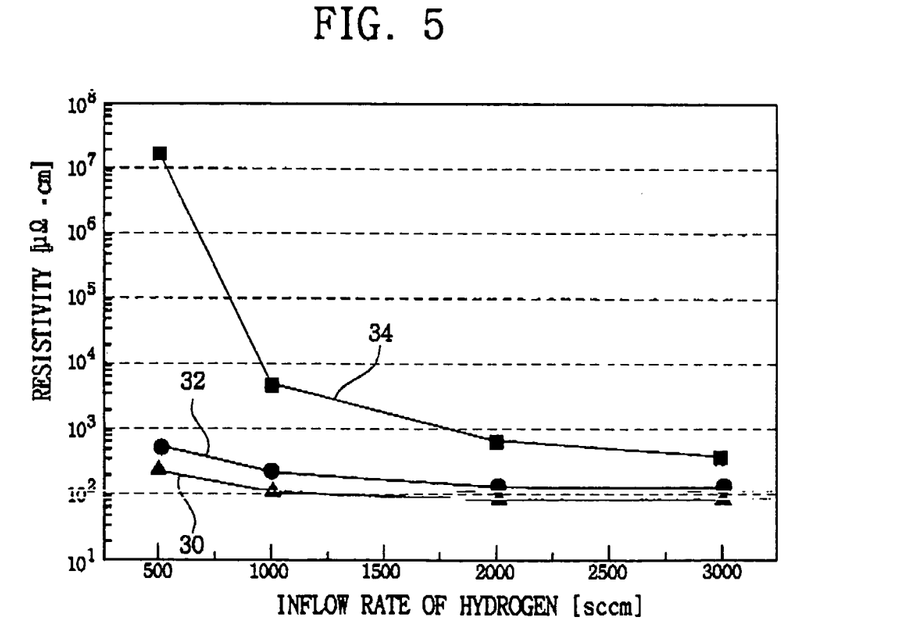
FIG. 5 is a graph illustrating the relationship between hydrogen inflow rate and resistivity, which is plotted by changing the hydrogen inflow rate and the pressure of in a deposition chamber.

Measuring the Relationship Among Inflow Rate of the Hydrogen Gas, the Pressure in the Deposition Chamber and the Resistivity of Cobalt Layer FIG. 5 is a graph showing a relationship between the hydrogen gas inflow rate and resistivity, which is plotted by changing hydrogen and pressure of a deposition chamber. In the graph, the x-axis represents inflow rate of hydrogen, and the y-axis represents resistivity. A first graph 32 corresponds to resistivity of a cobalt layer formed by methods of Examples 5 to 8, and a second graph 34 corresponds to resistivity of a cobalt layer formed by methods of Examples 9 to 12.

FIG. 5 further illustrates that as the inflow rate of hydrogen increases at a fixed pressure in the deposition chamber, the resistivity of cobalt layer decreases. Additionally, as the overall pressure of the deposition chamber increases, the resistivity of the cobalt layer decreases. Thus, the resistivity of the cobalt layer formed in accordance with Example 1 has a minimum value that is about 100 $\mu\Omega\cdot$cm.

Experiment 4

Figure 6:
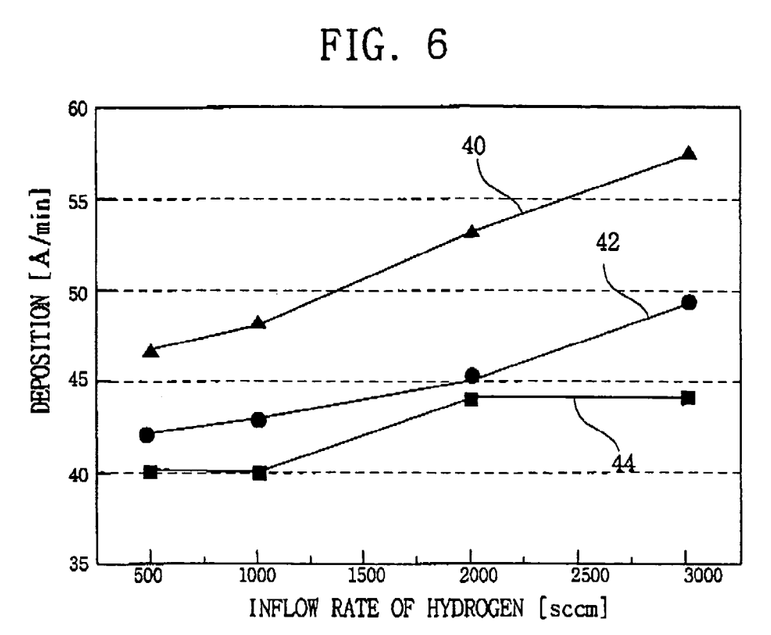
FIG. 6 is a graph showing a relationship between the inflow rate of a hydrogen gas and the deposition rate.

Measuring the Relationship Among Inflow Rate of the Hydrogen Gas, the Pressure in the Deposition Chamber and the Deposition Rate of Cobalt Layer FIG. 6 is a graph showing a relationship between inflow rate of hydrogen and deposition rate. In the graph, the x-axis represents inflow rate of hydrogen, and the y-axis represents deposition rate of cobalt layer. A first graph 40 corresponds to the deposition rate of the cobalt layer formed in accordance with Examples 1 to 4, a second graph 42 corresponds to the deposition rate of the cobalt layer formed in accordance with Examples 5 to 8, and a third graph 44 corresponds to the deposition rate of the cobalt layer formed in accordance with Examples 9 to 12.

FIG. 6 further illustrates that as the inflow rate of hydrogen increases at a fixed pressure, the deposition rate of a cobalt layer increases. Additionally, as the pressure of a deposition chamber increases due to the fixed inflow rate of hydrogen, the deposition rate of a cobalt layer increases. This demonstrates that the deposition rate of the cobalt layer formed in accordance with Example 1 had the highest value of about 57 Å/min. Thus, the deposition rate of a cobalt layer is influenced by an inflow rate of hydrogen and a pressure of the deposition chamber.

Experiment 5

Figure 7:
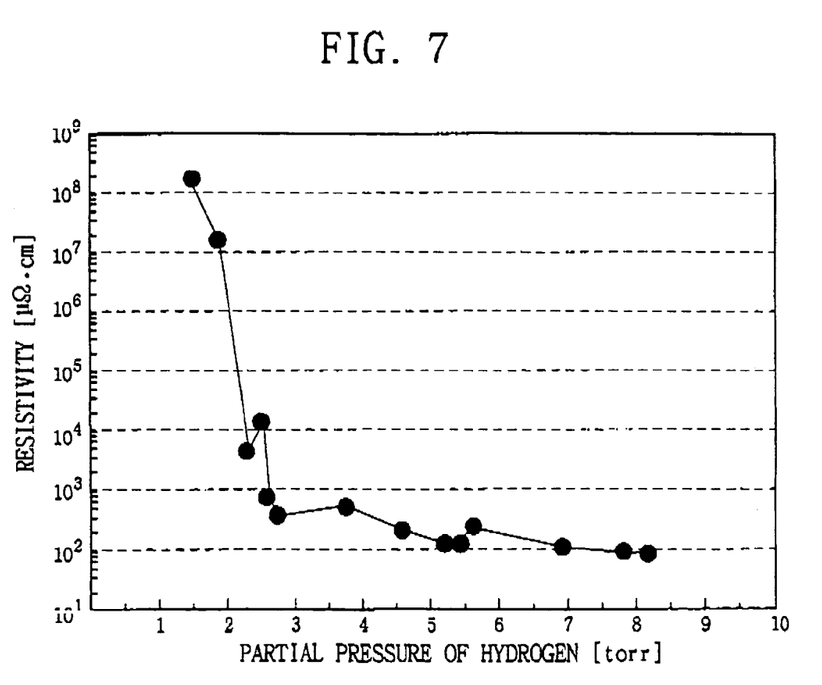
FIG. 7 is a graph showing a relationship between the partial pressure of a hydrogen gas and the resistivity of a cobalt layer.

Measuring the Relationship Between the Partial Pressure of the Hydrogen Gas and the Deposition Rate of the Cobalt Layer FIG. 7 is a graph showing a relationship between a partial pressure of hydrogen gas and resistivity of a cobalt layer. In the graph, the x-axis represents a partial pressure of hydrogen gas, and the y-axis represents resistivity of a cobalt layer.

FIG. 7 demonstrates that when no hydrogen is provided a cobalt layer has a resistivity of about $10^9$ $\mu\Omega\cdot$cm. It also shows that when a partial pressure of hydrogen gas is applied from about 0 Torr to about 3 Torr resistivity of a cobalt layer decreases rapidly as the partial pressure of the hydrogen gases increase. However, when the partial pressure of hydrogen gas exceeds about 3 Torr, resistivity of a cobalt layer can slowly decrease. Therefore, when the partial pressure of hydrogen gas exceeds about 7 Torr, the cobalt layer has resistivity of about 100 $\mu\Omega\cdot$cm. Thus, in order to form a cobalt layer having resistivity that is required for an integrated circuit device, a partial pressure of hydrogen gas should exceed approximately 2.5 Torr.

EXAMPLES 13 to 15

For Examples 13–15, a cobalt layer was formed under the same conditions as Example 1 except for changing the temperature in the deposition chamber. Temperatures provided in the deposition chamber, which correspond to each of Examples 13–15, are represented in the following table.

TABLE 1

|  | Temperature(° C.) |
| --- | --- |
| Example 13 | 170 |
| Example 14 | 190 |
| Example 15 | 210 |

EXAMPLE 16

A cobalt layer was formed under the same conditions provided in Example 12 except for changing the temperature of the deposition chamber. For the present example, the cobalt layer was formed at a temperature of about 170° C.

EXAMPLE 17

A cobalt layer was formed under the same conditions provided in Example 12 except for hanging the temperature of the deposition chamber. For the present example the cobalt layer was formed at a temperature of about 190° C.

Comparative Examples 1 to 3

For comparative example 1 to 2, a silicon substrate was loaded in a deposition chamber. The pressure of the deposition chamber was adjusted to be approximately 3 Torr. Later, vaporized CCTBA was added into the deposition chamber by argon gas that functioned as a carrier, wherein the argon gas was introduced into the deposition chamber at a flow rate of about 100 sccm.

Hydrogen gas was provided into the deposition chamber at a flow rate of about 100 sccm to form cobalt layer. Thus, a cobalt layer was formed under conditions wherein the partial pressure of hydrogen gas was lower than about 1.5 Torr.

Comparative examples 1 to 3 were produced in the same manner except for changing the temperature. The temperature differences are noted in the following table.

TABLE 2

|  | Temperature(° C.) |
| --- | --- |
| Comparative Example 1 | 150 |
| Comparative Example 2 | 170 |
| Comparative Example 3 | 190 |

Experiment 6

Figure 8:
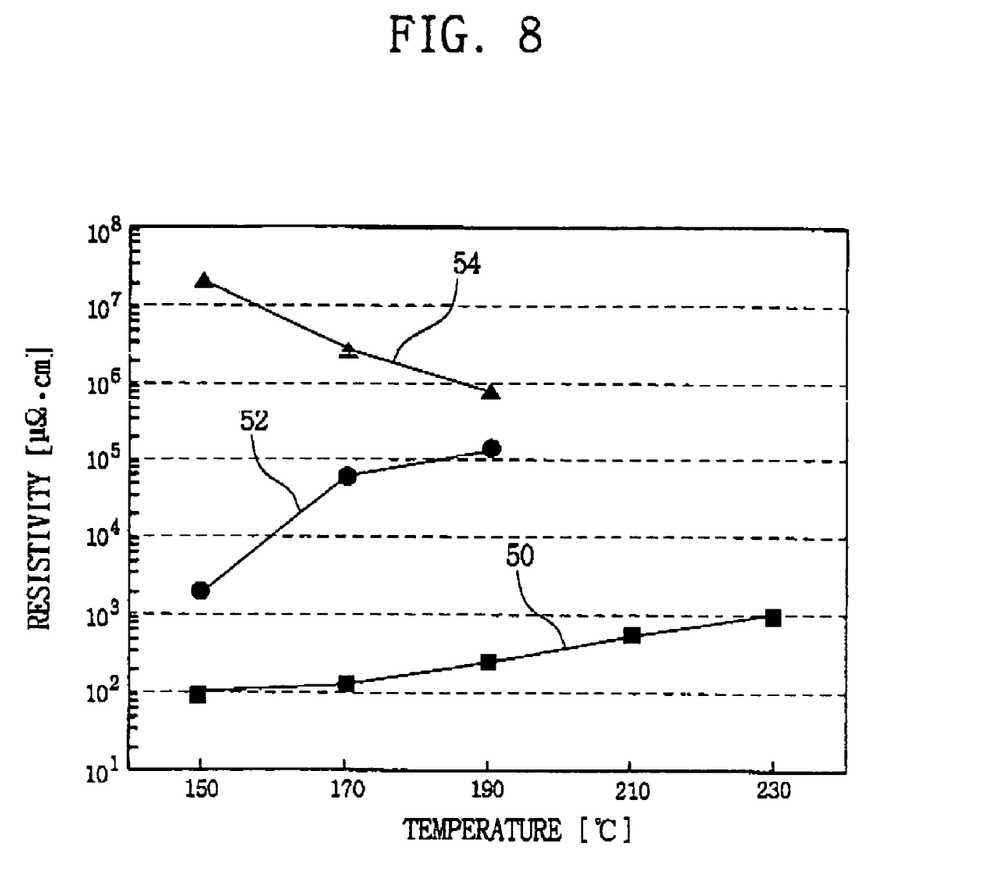
FIG. 8 is a graph showing a relationship between the temperature in the deposition chamber and the resistivity of a cobalt layer.

Measuring the Relationship Between the Temperature of Deposition and Resistivity FIG. 8 is a graph showing a relationship between the temperature in a deposition chamber and the resistivity of a cobalt layer. In the graph, the x-axis represents temperature of a deposition chamber, and the y-axis represents resistivity of a cobalt layer.

A first graph 50, corresponds to a resistivity of cobalt layers formed by the methods described in Example 1 and Examples 13 to 15. A second graph 52, corresponds to a resistivity of cobalt layers formed by the methods of Example 12 and Examples 17 and 18. A third graph 54, corresponds to a resistivity of cobalt layers formed by Comparative examples 1 to 3.

FIG. 8 demonstrates the resistivity of cobalt layers formed in accordance with Example 1 and Examples 13 to 15, and the resistivity of cobalt layer formed in accordance with Example 12 and Examples 17 and 18. FIG. 8 also demonstrates that the resistivity of the cobalt layer formed by the method of Example 1 has a lowest value of about 100 $\mu\Omega\cdot cm$.

Additionally, it was shown that the resistivity of cobalt layers formed by methods of Comparative examples 1 to 3 decreases as temperature increases. The resistivity of Comparative examples 1 to 3 is in the order of $10^6$ $\mu\Omega\cdot cm$. Thus, even though the resistivity is decreased, the cobalt layers formed by methods of Comparative examples 1 to 3 are inadequate for integrated circuit devices.

Figure 9A:
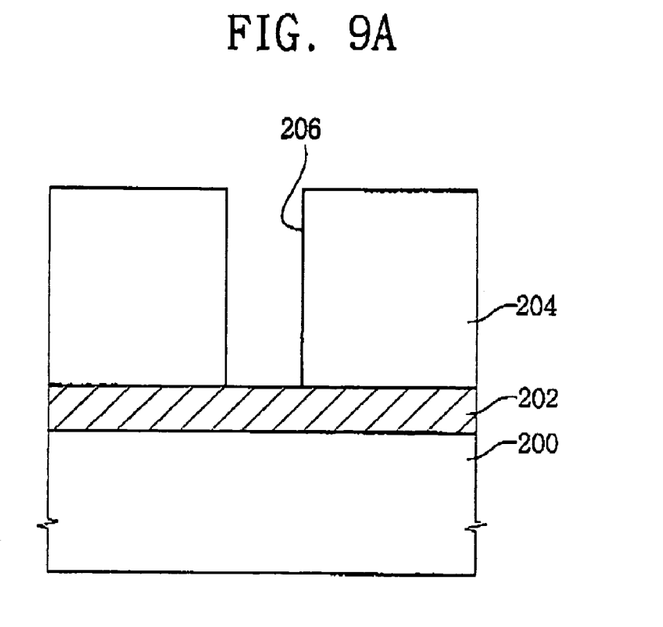
FIGS. 9A and 9B are cross-sectional views of an integrated circuit device showing a cobalt layer formed on an inner surface of contact hole and insulation layer.
Figure 9B:
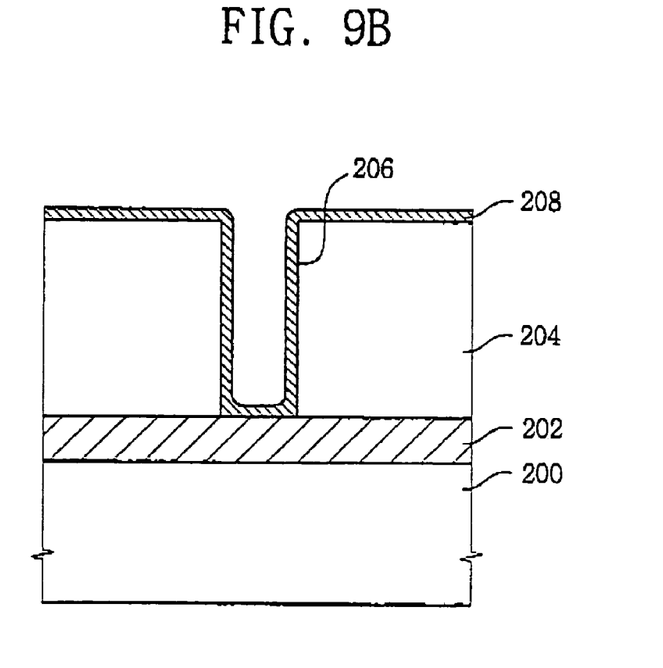

FIGS. 9A and 9B are cross-sectional views illustrating a cobalt layer on the inner surface of a contact hole and an insulation layer. FIG. 9A illustrates a polysilicon layer 202 on an integrated circuit device 200. An insulation layer 204 may be formed on the polysilicon layer 202. A portion of the insulation layer 204 may be removed, so that a contact hole 206 is formed. The insulation layer 204 may undergo a cleaning process by using plasma, etc.

In FIG. 9B, a cobalt layer 208 may be formed on an inner surface of the contact hole 206, a bottom surface of the contact hole 206, and the insulation layer 202. The cobalt layer 208 may be formed by various deposition methods. As noted above, these deposition methods can include a precursor of $Co_2(CO)_6Co_2(CO)_6(R^1—C\equiv C—R^2)$ (wherein $R^1$ represents H or $CH_3$, and $R^2$ represent H, $^tBu$, phenyl, methyl or ethyl) wherein the precursor is vaporized. The vaporized precursor is provided to the integrated circuit device by inert gas that corresponds to a carrier. In order to remove elements that are combined with cobalt, a reaction gas, such as hydrogen gas, is provided to the integrated circuit device, such that a partial pressure of hydrogen gas exceeds approximately 2.5 Torr. The temperature of the integrated circuit device loaded in the deposition chamber ranges from about 50° C. to about 500° C.

The cobalt layer 208 undergoes a thermal process, so that the cobalt layer 208 reacts with polysilicon to form a cobalt silicide layer. The cobalt silicide layer corresponds to an ohmic layer of contact. The cobalt silicide layer formed by the above-described methods has good step coverage and high purity. This coverage and purity allows for the resistivity of the cobalt silicide layer to be reduced so that contact-resistance of the contact hole 206 is reduced. The cobalt suicide layer that makes up the ohmic layer can be formed in a contact region that includes silicon.

Figure 10A:
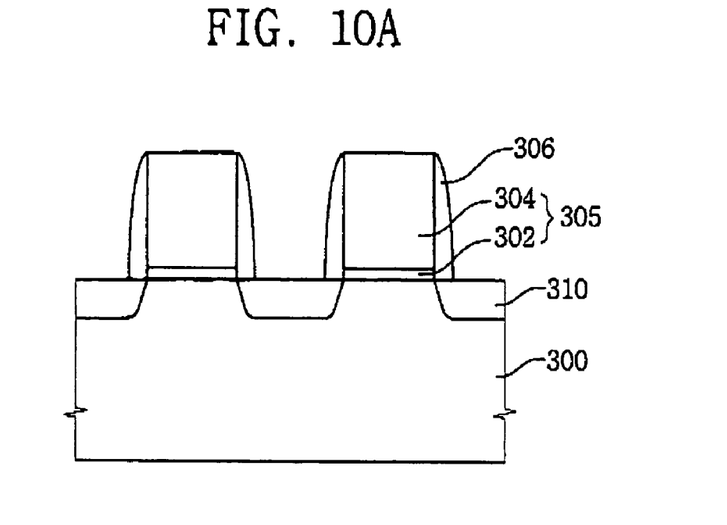
FIGS. 10A and 10B are cross-sectional views of an integrated circuit device showing a cobalt layer formed on an integrated circuit device having a gate electrode pattern formed thereon.
Figure 10B:
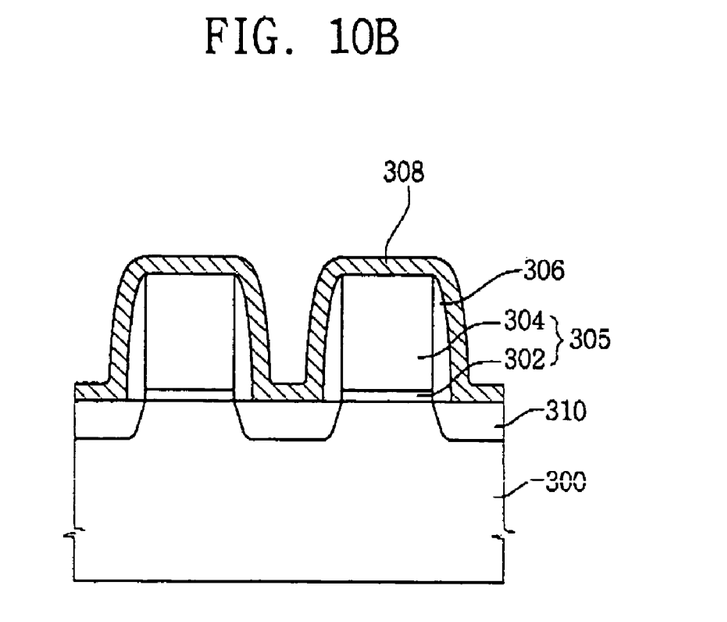

FIGS. 10A and 10B are cross-sectional views showing a finished integrated circuit device produced by some of the embodiments of the present invention including methods of forming a cobalt layer on an integrated circuit device having a gate electrode pattern formed thereon.

FIG. 10A illustrates a gate electrode 305 that includes a gate oxidation pattern 302 and polysilicon layer pattern 304 formed on an integrated circuit device 300. A source and drain electrode region 310 is formed at surfaces of the integrated circuit device 300, which are adjacent to the gate electrode 305. Spacers 306 are formed at side surfaces of the gate electrode 305.

FIG. 10B illustrates a cobalt layer 308 on a surface of the gate electrode 305, the spacers 306 and the integrated circuit device 300. The cobalt layer 308 can be formed via the deposition methods described throughout the application. The cobalt layer 308 can undergo a thermal process so that cobalt layer 308 reacts with polysilicon to form a cobalt silicide layer on an upper surface of gate electrode comprising polysilicon, and the source and drain region, selectively. The cobalt silicide has low resistivity, so that resistance between the gate electrode and the source and drain region is reduced.

Experiment 7

Determining Step Coverage

Step coverage of the cobalt layers formed by the methods described in Experiments 1 to 12 was also tested. The step coverage of the cobalt layer of a contact hole, of which a length and breadth ratio was 6:1, was measured. The step coverage is a ratio of a thickness of a cobalt layer formed near the gate electrode as compared to the thickness of a cobalt layer formed on a bottom face between the gate electrodes. The step coverage of the cobalt layer formed by the method disclosed in Experiment 1 was about 47%. The step coverage of the cobalt layer formed by the method disclosed in Experiment 2 was about 85%. Thus, the step coverage of the Example 12 was better than the step coverage of Example 1. Accordingly, a cobalt layer having good step coverage and high purity may be formed by reducing the hydrogen gas into a deposition chamber at a flow rate of approximately 500 sccm. Furthermore, when the cobalt layer is formed on a silicon layer, an oxidation layer is not formed between the cobalt layer and the silicon layer. Thus, a cobalt silicide layer may be easily formed.

It should be noted that many variations and modifications might be made to the embodiments described above without substantially departing from the principles of the present invention. All such variations and modifications are intended to be included herein within the scope of the present invention, as set forth in the following claims.

What is claimed is:

1. A method of depositing a metal layer on an integrated circuit device, comprising:
   loading the integrated circuit device in a deposition chamber;
   providing the deposition chamber with a transition metal precursor;
   providing the deposition chamber with a carrier gas, such that a partial pressure of the precursor and carrier gas exceeds about 0.25 Torr;
   providing the deposition chamber with a hydrogen gas, such that a partial pressure of the hydrogen gas exceeds about 2.5 Torr; and
   decomposing the transition metal precursor with the hydrogen gas to form a metal layer on the integrated circuit device.

2. A method according to claim 1, wherein the partial pressure of the precursor and the carrier ranges from about 0.25 Torr to 97.5 Torr, and the partial pressure of the hydrogen gas ranges from about 2.5 Torr to 99.75 Torr.

3. A method according to claim 1, wherein a ratio of the precursor and carrier gas to hydrogen is in a range from about 1:39 to 1:399.

4. A method according to claim 1, wherein the precursor comprises cobalt-cobalt bonding.

5. A method according to claim 1, wherein the precursor is selected from the group consisting of dicobalt hexacarbonyl t-butylacetylene [$Co_2(CO)_6(HC\equiv C^tBu)$], dicobalt hexacarbonyl phenylacetylene [$Co_2(CO)_6(HC\equiv CPh)$], dicobalt hexacarbonyl methylacetylene [$Co_2(CO)_6(HC\equiv CCH_3)$], and dicobalt hexacarbonyl dimethylacetylene [$Co_2(CO)_6(CH_3C\equiv CCH3)$] or a mixture thereof.

6. A method according to claim 1, further comprising vaporizing the transition metal precursor prior to providing the deposition chamber with a hydrogen gas.

7. A method according to claim 1, wherein the precursor and the hydrogen gas are provided at a temperature from about 50° C. to 500° C.

8. A method according to claim 1, wherein the hydrogen gas is in a molecular state or a radical state.

9. A method according to claim 1, wherein the carrier gas corresponds to an inert gas.

10. A method of forming a cobalt layer on an integrated circuit device comprising:
depositing a cobalt precursor on an integrated circuit device in a deposition chamber;
providing hydrogen gas to the deposition chamber such that the partial pressure of the hydrogen gas exceeds about 2.5 Torr; and
decomposing the cobalt precursor with hydrogen gas on the integrated circuit device to form a cobalt layer.

11. A method according to claim 10, wherein the cobalt precursor is selected from the group consisting of dicobalt hexacarbonyl t-butylacetylene [$Co_2(CO)_6(HC\equiv C^tBu)$], dicobalt hexacarbonyl phenylacetylene [$Co_2(CO)_6(HC\equiv CPh)$], dicobalt hexacarbonyl methylacetylene [$Co_2(CO)_6(HC\equiv CCH_3)$], and dicobalt hexacarbonyl dimethylacetylene [$Co_2(CO)_6(CH_3C\equiv CCH_3)$] or a mixture thereof.

12. A method according to claim 10, further comprising vaporizing the cobalt precursor prior to introducing the hydrogen gas into the deposition chamber.

13. A method according to claim 10, wherein the precursor and the hydrogen gas are provided at a temperature from about 50° C. to 500° C.

14. A method according to claim 10, wherein the hydrogen gas is in a molecular state or radical state.

15. A method according to claim 10, wherein the cobalt precursor is provided by carrier gas.

16. A method according to claim 15, wherein the cobalt precursor carried by the carrier gas is provided, such that a partial pressure of the cobalt precursor and the carrier gas exceeds about 0.25 Torr.

17. A method of forming a cobalt layer on an integrated circuit device, comprising:
forming an insulation layer on an integrated circuit device;
removing a portion of the insulation layer to form a contact hole exposing the integrated circuit device;
depositing a cobalt precursor on the integrated circuit device in a deposition chamber;
supplying hydrogen gas to the deposition chamber such that the partial pressure of the hydrogen gas exceeds about 25 Torr; and
decomposing the cobalt precursor with hydrogen gas on the integrated circuit device to form a cobalt layer on at least one side and at least one bottom surface of the contact hole, and on the top surface of the insulation layer.

18. A method according to claim 17, wherein the cobalt precursor is selected from the group consisting of dicobalt hexacarbonyl t-butylacetylene [$Co_2(CO)_6(HC\equiv C^tBu)$], dicobalt hexacarbonyl phenylacetylene [$Co_2(CO)_6(HC\equiv CPh)$], dicobalt hexacarbonyl methylacetylene [$Co_2(CO)_6(HC\equiv CCH_3)$], and dicobalt hexacarbonyl dimethylacetylene [$Co_2(CO)_6(CH_3C\equiv CCH_3)$], or a mixture thereof.

19. A method according to claim 17, wherein the cobalt precursor is provided into the deposition chamber by a carrier gas.

20. A method of forming a cobalt layer on a integrated circuit device comprising:
vaporizing a cobalt precursor;
combining the vaporized cobalt precursor and a carrier gas in a deposition chamber;
depositing the cobalt precursor on the integrated circuit device; and
decomposing the cobalt precursor with hydrogen gas on the integrated circuit device by providing hydrogen gas into the deposition chamber such that the partial pressure of the hydrogen gas exceeds about 2.5 Torr, to form the cobalt layer on the integrated circuit device.

21. A method according to claim 20, wherein said cobalt precursor is a compound comprising cobalt-cobalt bonding.

22. A method according to claim 21, wherein the cobalt precursor is selected from the group consisting of dicobalt hexacarbonyl t-butylacetylene [$Co_2(CO)_6(HC\equiv C^tBu)$], dicobalt hexacarbonyl phenylacetylene [$Co_2(CO)_6(HC\equiv CPh)$], dicobalt hexacarbonyl methylacetylene [$Co_2(CO)_6(HC\equiv CCH_3)$], and dicobalt hexacarbonyl dimethylacetylene [$Co_2(CO)_6(CH_3C\equiv CCH_3)$], or a mixture thereof.

23. A method according to claim 20, further comprising combining the vaporized cobalt precursor and a carrier gas in a deposition chamber wherein the deposition chamber temperature is maintained between 50° C. and 500° C.

* * * * *

UNITED STATES PATENT AND TRADEMARK OFFICE
CERTIFICATE OF CORRECTION

PATENT NO. : 7,285,493 B2  Page 1 of 1
APPLICATION NO. : 10/818718
DATED : October 23, 2007
INVENTOR(S) : Kang et al.

It is certified that error appears in the above-identified patent and that said Letters Patent is hereby corrected as shown below:

Column 13, Line 53: Please correct "cobait"
To read -- cobalt --

Column 14, line 11: Please correct "25 Torr;"
To read -- 2.5 Torr; --

Column 14, Line 20: Please correct " $[Co_2(CO)_6(HC \equiv C_tBu)]$ "
To read -- $[Co_2(CO)_6HC \equiv C^tBu)]$ --

Column 14, Line 45: Please correct " $[Co_2(CO)_6(HC \equiv C_tBu)]$ "
To read -- $[Co_2(CO)_6(HC \equiv C^tBu)]$ --

Signed and Sealed this

First Day of January, 2008

JON W. DUDAS
*Director of the United States Patent and Trademark Office*